United States Patent [19]

Chan et al.

[11] Patent Number: 5,461,255

[45] Date of Patent: Oct. 24, 1995

[54] MULTI-LAYERED LEAD FRAME ASSEMBLY FOR INTEGRATED CIRCUITS

[75] Inventors: Min Y Chan; Siu W. Low, both of Singapore, Singapore

[73] Assignee: Texas Instruments Incorporated, Dallas, Tex.

[21] Appl. No.: 182,314

[22] Filed: Jan. 14, 1994

Related U.S. Application Data

[63] Continuation of Ser. No. 947,203, Sep. 18, 1992.

[51] Int. Cl.⁶ .......................... H01L 23/48; H01L 29/44; H01L 29/52; H01L 29/60
[52] U.S. Cl. .......................... 257/672; 257/666; 257/668; 257/691
[58] Field of Search .................................. 257/664, 668, 257/666, 676, 691, 672; 361/407

[56] References Cited

U.S. PATENT DOCUMENTS

| | | | |
|---|---|---|---|
| 3,967,366 | 7/1976 | Birglechner et al. | 257/672 |
| 4,417,266 | 11/1983 | Grabbe | 357/80 |
| 4,587,548 | 5/1986 | Grabbe et al. | 357/70 |
| 4,796,078 | 1/1989 | Phelps, Jr. et al. | 257/668 |
| 4,801,999 | 1/1989 | Hayward et al. | 251/668 |
| 4,811,081 | 3/1989 | Lyden | 257/672 |
| 4,891,687 | 1/1990 | Mallik et al. | 357/70 |
| 5,070,390 | 12/1991 | Shimizu | 257/668 |
| 5,146,312 | 9/1992 | Lim | 257/668 |
| 5,206,536 | 4/1993 | Lim | 257/668 |
| 5,252,854 | 10/1993 | Aritaetali | 257/676 |

OTHER PUBLICATIONS

Hybrid Assembly Time Reduced with Purpose–Designed Chips, Electronic Engineering, Jun. 1972, vol. 44, No. 532, pp. 57, 59–61 Jordan.

*Primary Examiner*—Robert P. Limanek
*Assistant Examiner*—T. M. Arroyo
*Attorney, Agent, or Firm*—Christopher L. Maginniss; W. James Brady, III,; Richard L. Donaldson

[57] ABSTRACT

There is provided a packaged semiconductor device having a multi-layered lead frame assembly (38). An integrated circuit chip (12) has an active face (16) with a plurality of bond pads (18) disposed along its center line (14). A first pair of insulating adhesive tape strips (20) adhere a main lead frame (22) to the active face (16) of chip (12). A second pair of insulating adhesive tape strips (28) adhere a respective pair of bus lead frames (30) to the main lead frame (24). Welds (36) electrically interconnect selective leads (22) of main lead frame (22) with respective leads (32) of bus lead frames (30). Tab bonds (40) or wire bonds (42) electrically interconnect selective leads (24) of main lead frame (22) with bond pads (18) on chip (12).

7 Claims, 2 Drawing Sheets

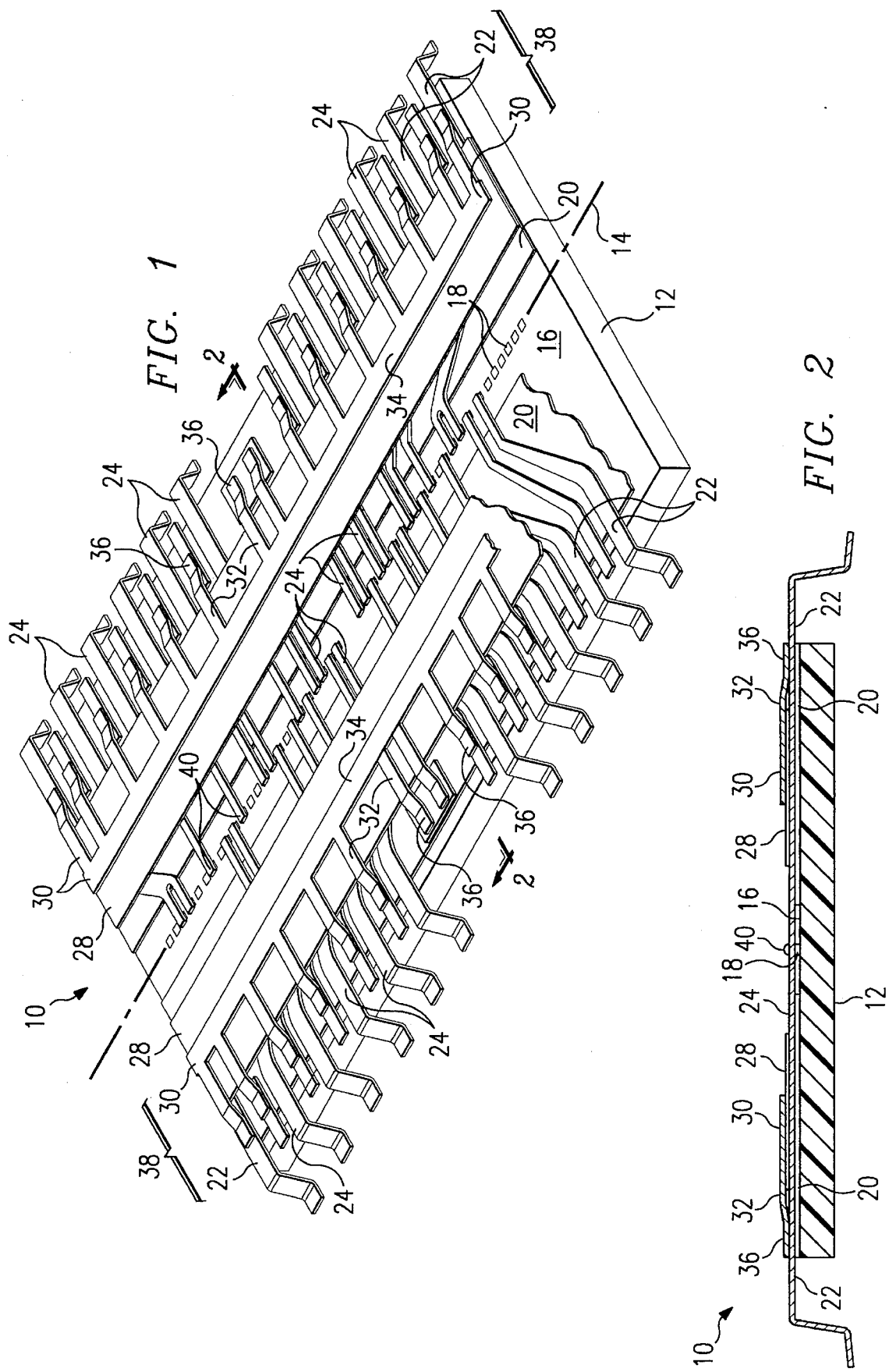

MULTI-LAYERED LEAD FRAME ASSEMBLY FOR INTEGRATED CIRCUITS

This application is a Continuation of application Ser. No. 07/947,203, filed Sep. 18, 1992.

TECHNICAL FIELD OF THE INVENTION

The present invention relates to integrated circuits and, more particularly, to a multi-layered lead frame assembly and method for use with integrated circuitry packaging.

BACKGROUND OF THE INVENTION

Various techniques have heretofore been used to package integrated circuits. For example, various configurations utilizing lead frames to connect integrated circuits have been developed, such as the flip chip design and the small outline J lead (SOJ) packaging techniques. In many of these prior techniques, the integrated circuit is mounted upon a pad provided by a lead frame, and wire bonds connect from the integrated circuit to conductive leads on the lead frame.

More recently, an integrated circuit packaging technique termed the lead on chip (LOC) technique has been developed for plastic encapsulated packages. As described in the article entitled *Volume Production of Unique Plastic Surface-Mount Modules for the IBM 80-ns 1-Mbit DRAM Chip by Area Wire Bond Techniques* by William C. Ward, published at the 38th ECC in 1988, this technique disposes a lead frame over the active area of an integrated circuit. Insulating adhesive tape connects the lead frame over the integrated circuit chip, and wire bonds connect the circuit directly to the power buses on the lead frame or jumper over the power buses to conductive leads to provide the correct signal routing. The entire structure, with the exception of the J-shaped lead fingers, is then encapsulated in plastic by molding.

The lead on chip technique provides several advantages over prior packaging techniques. First, the ability to jump wires over various lead frame leads provides significant advantages by allowing alterable package I/O without chip redesign, since the wires can readily be routed over various buses or leads similar to conventional wire bonding as done on direct chip attached circuit cards. The lead on chip technique also provides significant electrical advantages over prior techniques. As chip sizes have increased, on chip busing of power and ground becomes disadvantageous because of high resistance and/or inductance in the on chip bus. High resistance developed in the long lines of thin film aluminum typically used in integrated circuit construction results in unacceptably large voltage drops in the bus. The lead on chip technique permits a comparatively much heavier bus, with a correspondingly much lower resistance, to be fabricated in the lead frame external to the chip. The voltage drop in the bus is thus lowered significantly by use of lead on chip packaging. Bus resistance can be further reduced by providing multiple contacts from chip bond pads to the lead frame bus.

Similarly, bus inductance can be reduced by use of lead frame rather than on chip busing. The lead on chip technique lowers the inductance of the signal, power and ground leads for the package because the lead frame bus has much lower inductance than long bond wires of previous techniques. Furthermore, by providing two pins for power and ground, the inductance is approximately half that of a single lead with multiple contacts.

An additional advantage realized by the lead on chip packaging technique is improved heat dissipation accomplished by the close proximity of the metal lead frame to the chip junctions. Finally, the pin count of a packaged chip may be reduced by use of the lead frame bus with multiple wire bonds to the bus.

An inherent disadvantage exists with current lead on chip designs, however. This arises from the location of lead frame power and ground buses between bond pads on the integrated circuit chip and the inner ends of the signal leads of the lead frame. These locations for the buses require that wire bonds from the chip bond pads to the signal leads must jump or bridge over a power or ground bus, creating a risk of wire bond short circuiting to the bus. The opportunity for shorting may arise from assembly processes such as poor bond location, wire loop control, mold compound sweep, or from accidental touching during processing.

One approach to minimize shorting problems suggests the use of insulated wire. See, *Insulated Aluminum Bonding Wire For High Lead Count Packaging* by Alex J. Oto, International Journal for Hybrid Microelectronics, Vol. 9, No. 1, 1986. While insulated wire has been reported to have some degree of success in conventional assembly packages, the successful implementation in a lead on chip package is questionable due to the nature of the wire bond stitch as it occurs over the insulating film on top of the integrated circuit. The probability of reliable implementation of insulated wire bonds on a production scale is therefore unlikely. Furthermore, insulated wire is expensive.

The demand for ever higher board density and thinner integrated circuit packaging had lead to another recently developed semiconductor packaging technique known as tape automated bonding (TAB), or tab bonding. The tab bonding technique replaces the traditional lead frame with a one, two, or three layer continuous film, or lead tape, containing conductive lead fingers. The wire bond of lead on chip packaging is replaced with a thermocompression, metallurgical bond between the chip bond pad and the tip of a lead finger. The tab bond requires that the bond pad, the lead finger tip, or both, be "bumped" with a thin metal layer, typically of gold, copper plated with gold, or titanium tungsten and gold, to form a 1 mil thick rectangular bump. Tab bonding is complete when sufficient heat and pressure have been applied to the lead finger and bond pad for a sufficient time period to form a metallurgical bond. See, *Overview of Tape Automated Bonding* by J. H. Lau, Electronic Materials Handbook, Vol. 1, 1989, p. 275, 285–286.

Tab bonding technology, however, suffers from at least one inherent disadvantage in comparison with conventional lead on chip packaging with wire bonding. Because the signal lead fingers must be brought into physical contact with the integrated circuit chip bond pads, it has heretofore not been feasible to locate power and ground buses on the lead tape adjacent the conductive lead fingers.

A need has thus arisen for a semiconductor packaging apparatus having the recognized advantages of lead on chip packaging and on chip busing, but which does not require that bond wires bridge over the buses, or the use of insulated bonding wire. Preferably, such a packaging apparatus will be adaptable for use with either wire or tab bonding techniques.

SUMMARY OF THE INVENTION

The present invention provides a semiconductor device which comprises an integrated circuit chip, a main lead frame, and a pair of bus lead frames. The main lead frame and bus lead frames each include a plurality of conductive leads. A first pair of insulating adhesive tape strips adhere the main lead frame to the integrated circuit chip. A second pair of insulating adhesive tape strips adhere the bus lead frames to the main lead frame on the side opposite the integrated circuit chip. Tab or wire bonds electrically interconnect bond pads on the integrated circuit chip with selective leads of the main lead frame. Welds electrically interconnect selective leads of the main lead frame with selective leads of the bus lead frames.

The multi-layered lead frame assembly and method of the present invention permits fabrication of a wire bonded, lead on chip packaged semiconductor device without any wire bonds crossing over on chip buses. Thus, the risk of wire bond short circuiting to a bus is completely eliminated.

The lead frame assembly and method of this invention also permits fabrication of a tab bonded, lead on chip packaged semiconductor device with on chip busing of power and ground.

BRIEF DESCRIPTION OF THE DRAWINGS

For a more complete understanding of the present invention and the advantages thereof, reference is now made to the following detailed description taken in conjunction with the accompanying drawings, in which:

FIG. 1 is a perspective view, partially broken away, of a packaged semiconductor device of the present invention, wherein the encapsulating mold compound has been removed to reveal the internal components.

FIG. 2 is a cross-sectional elevation view of the semiconductor device of FIG. 1, taken along line 2—2 in FIG. 1.

DETAILED DESCRIPTION OF THE INVENTION

Figure 3:
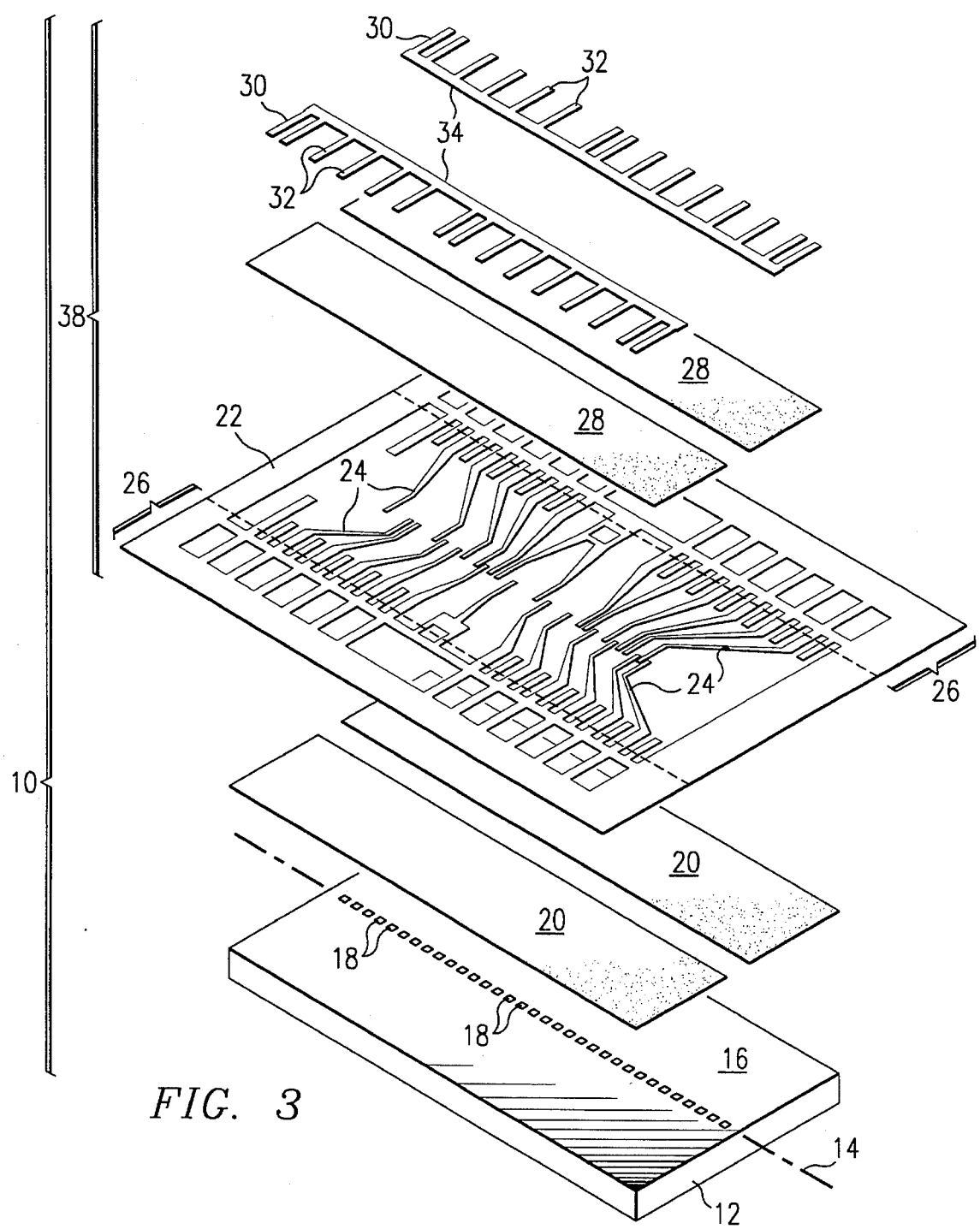
FIG. 3 is an exploded, perspective view of the semiconductor device of FIG. 1, showing the component parts as they might exist prior to assembly and package finishing.

The preferred embodiment of the present invention and its advantages are best understood by referring to the drawings, like numerals being used for like and corresponding parts of the various drawings.

Referring to FIGS. 1 and 3, there are shown a partially broken away, perspective view, and an exploded view of a packaged semiconductor device, generally designated 10, of the present invention. The encapsulating mold compound has been removed in FIG. 1 to reveal the internal components of device 10. As seen, semiconductor device 10 includes several layers of components connected close together. At the bottom of device 10 is integrated circuit chip 12. In the embodiments of this invention illustrated herein, integrated circuit chip 12 comprises a large, dynamic random access memory circuit, such as a 16 meg DRAM. However, it is to be understood that the multi-layered lead frame assembly and method of the present invention is equally applicable to other types of integrated circuit chips.

As seen in FIGS. 1 and 3, disposed along the center line 14 of the active face 16 of integrated circuit chip 12 are a plurality of bond pads 18. A first pair of insulating adhesive tape strips 20 are adhered to the active face 16 of integrated circuit chip 12, one insulating adhesive tape strip 20 being disposed on each side of bond pads 18. Adhesive tape strips 20 are spaced apart slightly to permit access to bond pads 18. Insulating adhesive tape strips 20 preferably comprise double-sided, thermosetting, epoxy adhesive coated polyimide film. This type of insulating adhesive tape is commercially available under the trade names Kapton and Upilex.

Adhered to the opposite sides of insulating adhesive tape strips 20 from integrated circuit chip 12 is a main lead frame 22. Main lead frame 22 comprises a plurality of conductive leads 24, which are used to route signals between integrated circuit chip 12 and external circuitry for the device in which semiconductor device 10 is to be used. Main lead frame 22 preferably comprises full hard temper CDA alloy 151, which can be punched or etched and is spot or full plated with a precious metal. The excess lead material 26 on main lead frame 22 in FIG. 3 has been trimmed away in packaged device 10 in FIG. 1. Additionally, the outer ends of protruding leads 24 in FIG. 1 have been bent to permit connection to external circuitry.

A second pair of insulating adhesive tape strips 28 are adhered to the opposite side of main lead frame 22 from the first pair of insulating adhesive tape strips 20. Adhesive tape strips 28, like adhesive tape strips 20, are disposed parallel to one another and extend substantially along the length of integrated circuit chip 12. Each adhesive tape strip 28 generally overlies a respective adhesive tape strip 20. Adhesive tape strips 28 preferably comprise double-sided, thermosetting epoxy adhesive coated polyimide film, such as Kapton or Upilex.

Adhered to the opposite side of each insulating adhesive tape strip 28 from main lead frame 22 is a bus lead frame 30. Each bus lead frame 30 comprises a plurality of conductive leads 32 which are connected at their ends by bus 34. Bus lead frames 30 may be used as power and ground buses for integrated circuit chip 12, for example. As seen, bus lead frames 30 extend substantially along the length of integrated circuit chip 12. Bus lead frames 30, like main lead frame 22, preferably comprise full hard temper CDA alloy 151.

As seen in FIG. 1, selective leads 24 of main lead frame 22 are welded at spot welds 36 to selective leads 32 of bus lead frames 30. Welds 36 electrically interconnect various leads 24 of main lead frame 22 with one of buses 30. By their interconnection through welds 36, main lead frame 22 and bus lead frames 30 thus form a two-layered lead frame assembly 38.

Figure 4:
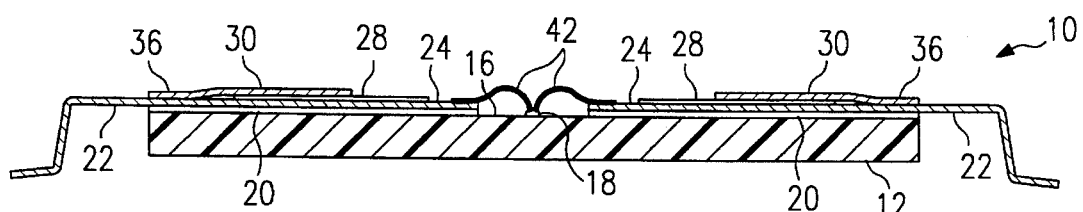
FIG. 4 is a cross-sectional, elevation view of an alternative embodiment of the present invention in which wire bonds connect the lead frame assembly with the integrated circuit chip.

Selective leads 24 of main lead frame 22 are electrically connected at their inner ends to bond pads 18 on integrated circuit chip 12, as required to provide correct signal routing. Leads 24 may be bonded to bond pads 18 by tab bonds 40, as illustrated in FIGS. 1 and 2, or by wire bonds 42, as illustrated in FIG. 4. Selective leads 24 of main lead frame 22 have outer ends which protrude from packaged semiconductor device 10 for connection to external circuitry, as illustrated in FIGS. 1, 2, and 4.

After semiconductor device 10 has been assembled as illustrated in FIG. 1, wire or tab bonding, as appropriate, is accomplished. Semiconductor device 10 is then encapsulated in a suitable plastic encapsulant (not illustrated), such as Novolac epoxy mold compound, by transfer molding process in the conventional manner. Finally, the remaining packaging steps of post mold cure, deflash, and lead preparation and finishing are accomplished in the conventional manner.

The multi-layered lead frame assembly 38 of the present invention advantageously permits fabrication of a wire bonded, lead on chip packaged semiconductor device without any wire bonds crossing over chip buses. Thus, the risk of wire bond short circuiting to a bus is completely avoided by the apparatus and method of this invention, without the need for insulated bonding wire. The apparatus and method of this invention also permits fabrication of a lead on chip packaged, tab bonded semiconductor device with on chip busing of power and ground. Thus, tab bonding technology becomes much more viable by the apparatus and method of this invention.

The present invention, and many of its intended advantages, will be understood from the foregoing description and it will be apparent that, although the invention and its advantages have been described in detail, various changes, substitutions and alterations may be made in the manner, procedure, and details thereof without departing from the spirit and scope of the invention, as defined by the appended claims, or sacrificing all of its material advantages, the form hereinbefore described being merely a preferred or exemplary embodiment thereof.

What is claimed is:

1. A semiconductor device, comprising:

an integrated circuit chip having an active face with a plurality of bond pads disposed along the center line of the chip;

a first pair of insulating adhesive tape strips having opposite sides, one side adhered to the active face of the integrated circuit chip, each strip of tape being disposed on an opposite side of the plurality of bond pads;

a main lead frame having opposite sides and including a plurality of conductive leads adhered to the first pair of the adhesive tape strips on the side opposite the integrated circuit chip;

a second pair of insulating adhesive tape strips having opposite sides, one side adhered to the main lead frame on the side opposite the first pair of adhesive tape strips;

bonds for electrically interconnecting the bond pads of the integrated circuit chip with respective leads of the main lead frame at inner ends thereof; and a pair of bus lead frames each including a plurality of conductive leads and each adhered to one of the second pair of adhesive tape strips on the side opposite the main lead frame, the leads of each bus lead frame being attached to respective leads of the main lead frame at the outer ends thereof.

2. The device of claim 1, wherein the pair of bus lead frames includes a power bus and a ground bus, each bus extending substantially along the length of the integrated circuit chip.

3. The device of claim 2, wherein the conductive leads of the main lead frame include:

a first plurality of leads welded to respective leads of the power bus;

a second plurality of leads welded to respective leads of the ground bus; and a third plurality of leads for connection to external circuitry.

4. The device of claim 1, wherein the bonds for electrically interconnecting the bond pads with respective leads of the main lead frame comprise wire bonds.

5. The device of claim 1, wherein the bonds for electrically interconnecting the bond pads with respective leads of the main lead frame comprise tab bonds.

6. The device of claim 1, wherein the main lead frame and the pair of bus lead frames comprise full hard temper CDA alloy 151.

7. The device of claim 6, wherein the integrated circuit chip comprises a dynamic random access memory.

* * * * *